(12) United States Patent
Wang

(10) Patent No.: US 11,349,105 B2
(45) Date of Patent: May 31, 2022

(54) FILM ATTACHING METHOD, MANUFACTURING METHOD OF DISPLAY PANEL AND DISPLAY DEVICE

(71) Applicant: BOE TECHNOLOGY GROUP CO., LTD., Beijing (CN)

(72) Inventor: Wei Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 604 days.

(21) Appl. No.: 16/333,093

(22) PCT Filed: Jun. 26, 2018

(86) PCT No.: PCT/CN2018/092881
§ 371 (c)(1),
(2) Date: Mar. 13, 2019

(87) PCT Pub. No.: WO2019/052258
PCT Pub. Date: Mar. 21, 2019

(65) Prior Publication Data
US 2021/0376298 A1  Dec. 2, 2021

(30) Foreign Application Priority Data

Sep. 12, 2017 (CN) .......................... 201710816300.0

(51) Int. Cl.
*H01L 51/56* (2006.01)
*H01L 51/52* (2006.01)
*H01L 51/00* (2006.01)

(52) U.S. Cl.
CPC .......... *H01L 51/56* (2013.01); *H01L 51/5253* (2013.01); *H01L 51/0097* (2013.01); *H01L 2251/5338* (2013.01); *H01L 2251/566* (2013.01)

(58) Field of Classification Search
None
See application file for complete search history.

(56) References Cited

U.S. PATENT DOCUMENTS 8,303,363 B2* 11/2012 Aiba ....................... H01L 51/56
                                                     445/24
10,109,810 B2  10/2018 Wang
(Continued)

FOREIGN PATENT DOCUMENTS

CN    103915473 A    7/2014
CN    105322104 A    2/2016
(Continued)

OTHER PUBLICATIONS

International Search Report of PCT/CN2018/092881 in Chinese, dated Sep. 10, 2018, with English translation.
(Continued)

*Primary Examiner* — J. E. Schoenholtz
(74) *Attorney, Agent, or Firm* — Collard & Roe, P.C.

(57) ABSTRACT

A film attaching method, and a manufacturing method of a display panel and a display device are disclosed. The film attaching method includes: a pre-cutting process and an attaching process. The pre-cutting process includes cutting the film in a thickness direction of the film to form a removed portion. The attaching process includes aligning the film having the removed portion with a display panel, and attaching the film having the removed portion on a surface to be attached of the display panel.

20 Claims, 10 Drawing Sheets

(56) References Cited

U.S. PATENT DOCUMENTS

| | | | |
|---|---|---|---|
| 10,618,263 B2* | 4/2020 | Chen | B32B 37/10 |
| 2011/0068682 A1* | 3/2011 | Aiba | H01L 51/5253 |
| | | | 313/504 |
| 2018/0086041 A1 | 3/2018 | Chen et al. | |

FOREIGN PATENT DOCUMENTS

| | | |
|---|---|---|
| CN | 105633281 A | 6/2016 |
| CN | 105690971 A | 6/2016 |
| CN | 106992139 A | 7/2017 |
| CN | 107650484 A | 2/2018 |
| JP | 2003071956 A | 3/2003 |

OTHER PUBLICATIONS

Notice of Transmittal of the International Search Report of PCT/CN2018/092881 in Chinese, dated Sep. 10, 2018.

Written Opinion of the International Searching Authority of PCT/CN2018/092881 in Chinese, dated Sep. 10, 2018 with English translation.

Chinese Office Action in Chinese Application No. 201710816300.0, dated Feb. 27, 2019 with English translation.

\* cited by examiner

FILM ATTACHING METHOD, MANUFACTURING METHOD OF DISPLAY PANEL AND DISPLAY DEVICE

CROSS REFERENCE TO RELATED APPLICATIONS

This application is the National Stage of PCT/CN2018/092881 filed on Jun. 26, 2018, which claims priority under 35 U.S.C. § 119 of Chinese Application No. 201710816300.0 filed on Sep. 12, 2017, the disclosure of which is incorporated by reference.

TECHNICAL FIELD

Embodiments of the present disclosure relate to a film attaching method, a manufacturing method of a display panel and a display device.

BACKGROUND

Compared with usual display panels, organic light-emitting diode (OLED) display panels not only have advantages, such as thinner and lighter volume, lower power consumption, which help to improve device endurance, but also have durability much higher than the usual display panels due to the characteristics of bendability and good flexibility, which reduces the probability of accidental damage.

SUMMARY

Embodiments of the present disclosure provide an film attaching method, a display panel, and a manufacturing method of a display device.

At least one embodiment of the present disclosure provides an film attaching method, comprising a pre-cutting process and an attaching process, wherein the pre-cutting process comprises cutting the film in a thickness direction of the film to form a removed portion; and the attaching process comprises aligning the film having the removed portion with a display panel, and attaching the film having the removed portion to a surface to be attached of the display panel.

In some embodiments, the pre-cutting process further comprises: forming a glue layer on a surface to be attached of the film having the removed portion.

In some embodiments, the pre-cutting process further comprises: forming a first protective film on a side of the glue layer away from the film.

In some embodiments, the attaching process further comprises: before attaching the film having the removed portion to the surface to be attached of the display panel, separating the first protective film from the glue layer.

In some embodiments, the pre-cutting process further comprises: before cutting the film, forming a glue layer and a first protective film on the film in sequence before cutting the film; after cutting the film, continuing to cut the glue layer and the first protective film in situ to penetrate the glue layer and the first protective film; and forming a second protective film on a surface of the first protective film away from the glue layer, wherein an adhesive force between the first protective film and the second protective film is greater than an adhesive force between the first protective film and the glue layer.

In some embodiments, the attaching process further comprises: before attaching the film having the removed portion to the surface to be attached of the display panel, separating the first protective film and the second protective film which are bonded together from the glue layer.

In some embodiments, the pre-cutting process further comprises: before cutting the film, forming a glue layer on the film and forming a first protective film on the glue layer, and after cutting the film, continuing to cut the glue layer in situ to penetrate the glue layer.

In some embodiments, the attaching process further comprises: before attaching the film having the removed portion to the surface to be attached of the display panel, separating the first protective film from the glue layer.

In some embodiments, the attaching process further comprises: attaching the film having the removed portion with the display panel through the glue layer.

In some embodiments, the pre-cutting process further comprises: forming a third protective film on a side opposite to the surface to be attached of the film having the removed portion.

In some embodiments, in the pre-cutting process, after placing and fixing the film on a vacuum adsorption stage, cutting the film.

In some embodiments, the removed portion is a closed opening, the display panel comprises a bonding region and a display region adjacent to the bonding region, upon attaching the film having the removed portion to the surface to be attached of the display panel, the removed portion corresponds to a first partition of the display panel, and the first partition is at least a part of the bonding region.

In some embodiments, the display panel comprises a bonding region and a display region adjacent to the bonding region, the removed portion comprises a linear removed portion, the linear removed portion corresponds to a boundary line between the bonding region and the display region.

In some embodiments, the film is separated by the linear removed portion into two separate portions.

In some embodiments, a length of the linear removed portion is larger than a width of the display panel in a lengthwise direction of the linear removed portion.

At least one embodiment of the present disclosure provides a manufacturing method of a display panel, comprising any one of the abovementioned film attaching method.

In some embodiments, the manufacturing method of the display panel further comprises cutting the display panel to separate the display panel, and removing the film in a bonding region of the display panel.

In some embodiments, the manufacturing method of the display panel further comprises: bonding an external circuit to the display panel.

In some embodiments, the manufacturing method of the display panel further comprises: providing a transparent substrate, and forming a flexible substrate on the transparent substrate; forming a display module in a display region of the flexible substrate, the film being attached on the display module; separating the transparent substrate from the flexible substrate by a laser stripping method; attaching a flexible substrate protective film on a surface of the flexible substrate away from the display module; and cutting the flexible substrate to form the display panel.

At least one embodiment of the present disclosure provides a manufacturing method of a display device, comprising any one of the abovementioned manufacturing method of the display panel.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In a process flow of a flexible display panel, in order to improve the production efficiency, a step of attaching a top protective film (TPF) on a substrate in a process for preparing flexible components, and processes of half-cutting and full-cutting the protective film in a bonding region by using a laser cutting method to form a plurality of display panels in a subsequent process are needed. In this way, the protective film in the bonding region can be removed. The half-cutting process is to cut the protective film without cutting a structure under the protective film. However, this method has the following problems: upon a laser being used for half-cutting, due to the influences of factors, such as energy instability, thickness difference of a film or unevenness of a cutting platform, the protective film at the half-cutting position is cut too deep or cut too shallow. If the protective film is cut too deep, a lead wire in the bonding region is cut off; if the protective film is cut too shallow, the protective film cannot be cut off, resulting in a problem that the protective film in a display region is simultaneously removed upon employing an automatic film removing process.

Figure 1:
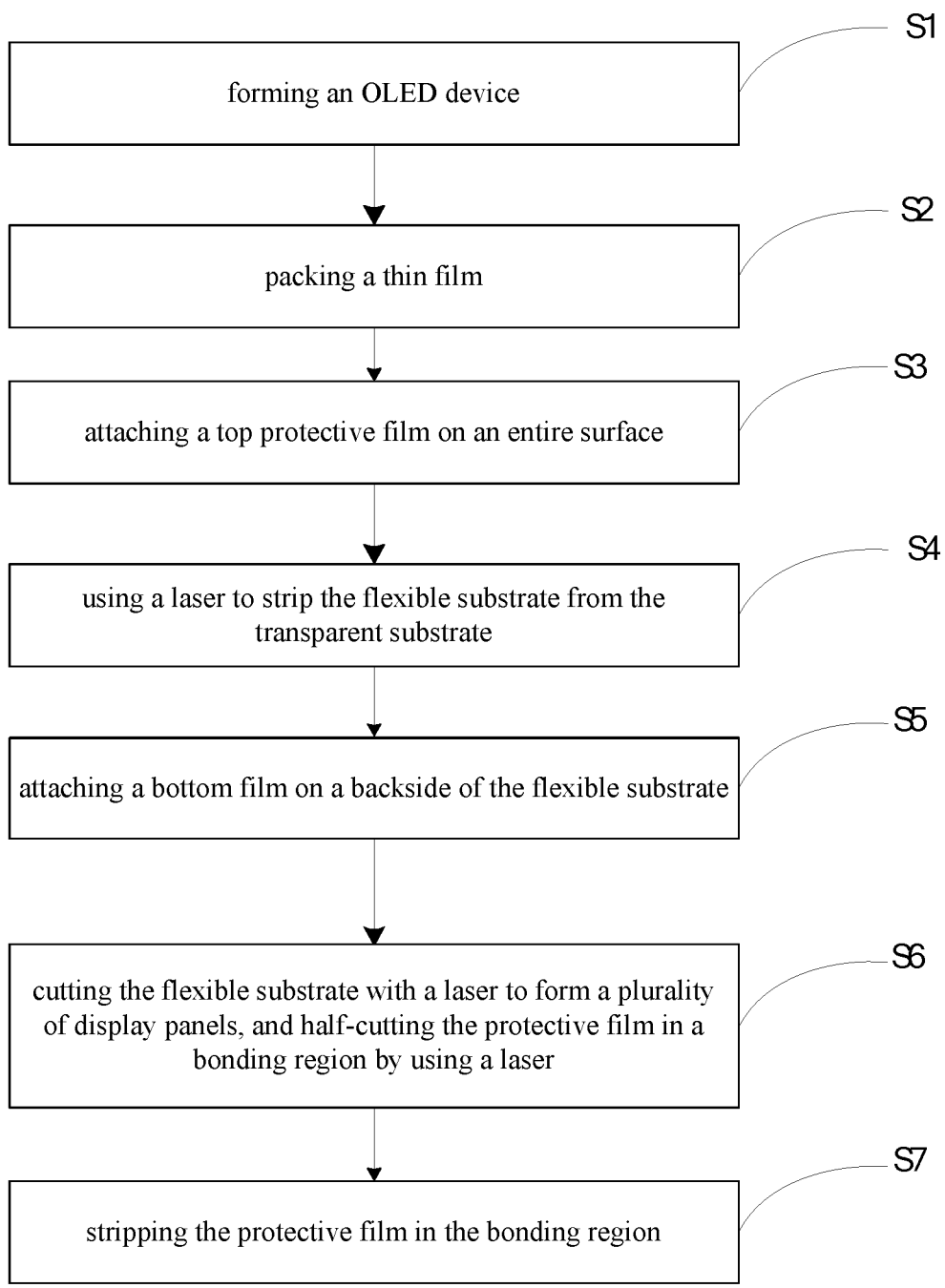
FIG. 1 is a process flow diagram of a flexible display panel.

FIG. 1 is a process flow diagram of a flexible display panel. Referring to FIG. 1, the process flow includes the following steps.

Step S1: forming an OLED device on a flexible substrate, and the flexible substrate being placed on a transparent substrate;

Step S2: performing thin film packaging;

Step S3: attaching a top protective film on an entire surface;

Step S4: using a laser to strip the flexible substrate from the transparent substrate;

Step S5: attaching a bottom film on a backside of the flexible substrate;

Step S6: cutting (full-cutting) the flexible substrate with a laser to form a plurality of display panels; and Step S7: stripping the protective film in a bonding region.

In step S6, the full cutting process can be performed before a half-cutting process, or can be performed after the half-cutting process.

In the abovementioned process flow, in order to improve the production efficiency, the top protective film (TPF) is attached to the substrate in a process for preparing flexible components (step S3), and a half-cutting process is performed on the protective film in the bonding region by using a laser in a subsequent process (step S6), and the protective film in the bonding region after the cutting process is removed (step S7). However, this method has the following problems: upon a laser being used for half-cutting, due to the influences of factors, such as energy instability, thickness difference of a film or unevenness of a cutting platform, the protective film at the half-cutting position is cut too deep or cut too shallow. If the protective film is cut too deep, a lead wire in the bonding region is cut off; if the protective film is cut too shallow, the protective film cannot be cut off, resulting in a problem that the protective film in a display region is simultaneously removed upon employing an automatic film removing process.

Accordingly, at least one embodiment of the present disclosure provides a film attaching method, including a pre-cutting process and an attaching process. The pre-cutting process includes cutting the film in a thickness direction of the film to form a removed portion. The attaching process includes aligning the film having the removed portion with a display panel, and attaching the film having the removed portion to a surface to be attached of the display panel. The film attaching method provided by the at least one embodiment of the present disclosure can be favorable to improving cutting yield and facilitate automation.

In order to enable those skilled in the art to better understand the technical solutions of the embodiments of the present disclosure, the attaching method of the film, the manufacturing method of the display panel and the display device provided by the embodiments of the present disclosure are described in detail below with reference to the accompanying drawings.

Figure 2:
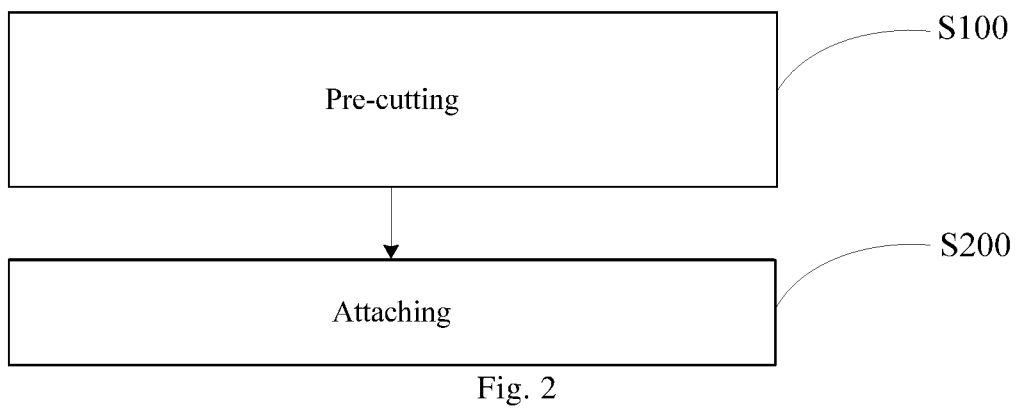
FIG. 2 is a flowchart of a film attaching method provided by an embodiment of the present disclosure.
Figure 3A:
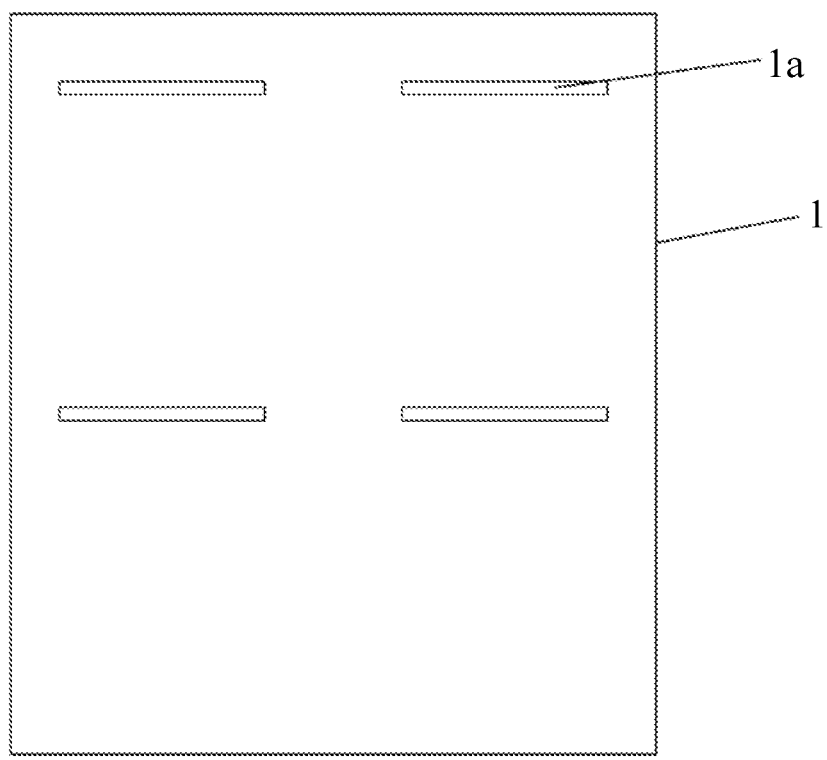
FIG. 3A is a plan view of a pre-cut film in a film attaching method provided by a first embodiment of the present disclosure.
Figure 3B:
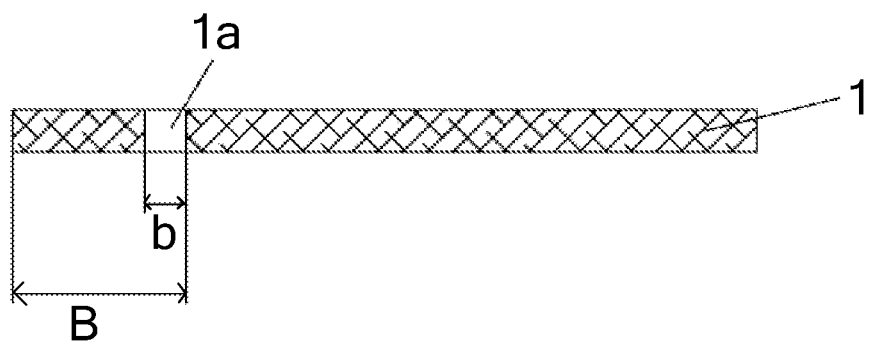
FIG. 3B is a partial cross-sectional view of a pre-cut film in a film attaching method provided by a first embodiment of the present disclosure.
Figure 3C:
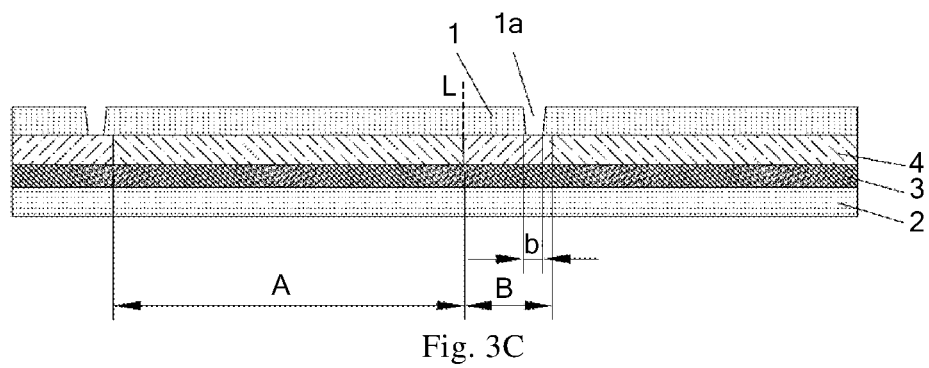
FIG. 3C is a structural diagram of an attached film in a film attaching method provided by a first embodiment of the present disclosure.

Referring to FIG. 2 to FIG. 3C together, at least one embodiment of the present disclosure provides a film attaching method, including:

Step S100: Pre-Cutting.

The film 1 is cut in a thickness direction of the film to remove a portion of the film 1 corresponding to a first partition b in a bonding region B of a display panel to form a removed portion 1a penetrating the film 1 in the thickness direction. That is, the removed portion 1a corresponds to the first partition b in the bonding region B of the display panel. For example, the removed portion 1a is overlapped with the first partition b in the thickness direction of the film 1. For example, the pre-cutting of the film 1 is performed before the film is attached to the display panel.

Step S200: Attaching.

After the cut film 1 is aligned with the display panel, the cut film 1 is attached to the surface to be attached of the display panel such that the removed portion 1a of the film 1 corresponds to the first partition b of the display panel. The cut film 1 is the film 1 having the removed portion 1a.

The expression that the removed portion 1a of the film 1 corresponds to the first partition b of the display panel refers to that, after the film 1 is attached to the surface to be attached of the display panel, a region where the removed portion 1a of the film 1 is located to directly face the first partition b. For example, on the surface to be attached of the display panel, an orthographic projection of the removed portion 1a of the film 1 coincides with the first partition b.

In FIG. 3A, a case where four removed portions 1a are formed in the film 1 is shown as an example. Each of the removed portions 1a may correspond to one first partition of the display panel.

In FIG. 3B, it is shown that the removed portion 1a penetrates the film 1. The removed portion 1a of the film 1 corresponds to the first partition b of the display panel. The first partition is at least a part of the bonding region B. For example, the bonding region B is a portion of the display panel where a plurality of lead wires which are insulated with each other are gathered and the lead wires are configured to be connected to an external circuit.

FIG. 3C is a schematic view showing that the film having the removed portion 1a as shown in FIG. 2 being attached to the display panel. As shown by FIG. 3C, the display panel includes a transparent substrate 2, a flexible substrate 3, and a display module 4, which are sequentially disposed. The display module 4 includes an array substrate, an OLED display component, and an encapsulation layer. The abovementioned film is used to protect the encapsulation layer from damage during the subsequent processes, and the flexible substrate 3 does not fall off the transparent substrate 2 upon the transparent substrate 2 being separated from the flexible substrate 3.

It should be noted that, in the display module 4, the array substrate is an entire layer of substrate, that is, the array substrate is located in a display region A and the bonding region B, but the OLED display component disposed on the array substrate is only located in the display region A, such that there is a step between the display region A and the bonding region B. However, because the OLED display component has a relatively small thickness, the step is also small, which is not shown in FIG. 3C. Further, the thickness of the abovementioned film 1 may be uniform at each position, but is not limited thereto.

For example, as shown in FIG. 3C, the display panel includes a bonding region B and a display region A adjacent to the bonding region B, and a boundary line L is displayed between the display region A and the bonding region B.

As shown in FIG. 3C, the abovementioned first partition b is a region corresponding to a region where the metal lead wires are located, and the region is usually located at a position in the bonding region B close to the display region A. In practical applications, the cutting process may be performed in accordance with a cutting drawing, which is favorable to making the removed portion 1a of the film 1 correspond to the first partition b of the display panel.

Figure 3D:
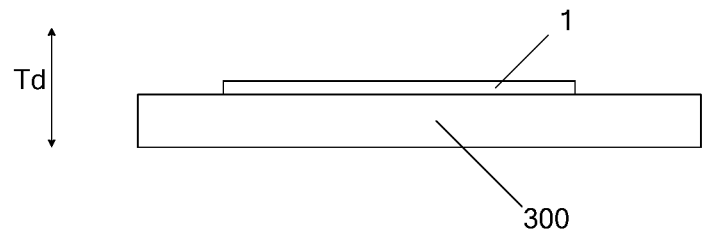
FIG. 3D is a schematic diagram showing a film being located on a vacuum adsorption stage in a film attaching method provided by an embodiment of the present disclosure.

FIG. 3D is a schematic view showing that the film is located on a vacuum adsorption stage in the attaching method of the film provided by an embodiment of the present disclosure. For example, after the film 1 is placed and fixed on the vacuum adsorption stage 300, the film 1 is cut along its thickness direction Td to remove a portion of the film 1 corresponding to the first partition b in the bonding region B of the display panel, which is favorable to the flatness of the film 1.

In the abovementioned pre-cutting process S100, the cutting may be performed by a punching process, and it is only required to place a blade at a position to be cut to directly cut off the film 1.

In the abovementioned attaching process S200, the cut film 1 is aligned with the display panel such that the removed portion 1a of the film 1 corresponds to the first partition b of the display panel.

By means of the abovementioned pre-cutting process S100, after the cutting of the film 1 is completed, the attaching may be performed, such that the problem that a lead wire in the bonding region is cut or the film cannot be cut off during a stripping process can be avoided, thereby improving the cutting yield and facilitating automation.

Figure 4A:
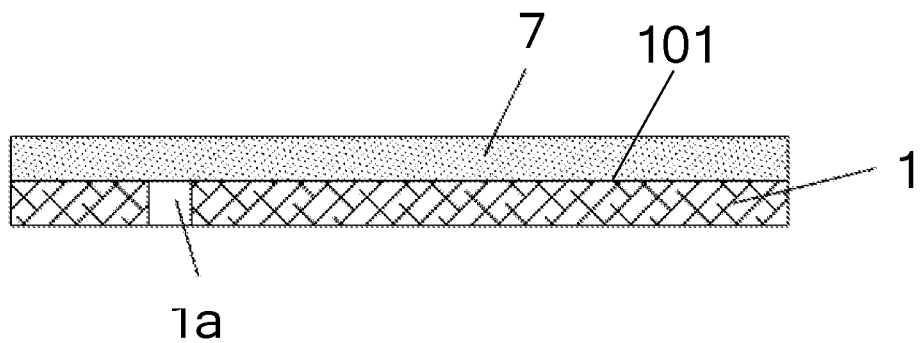
FIG. 4A is a structural diagram of a film after a pre-cutting process in a film attaching method provided by a second embodiment of the present disclosure.
Figure 4B:
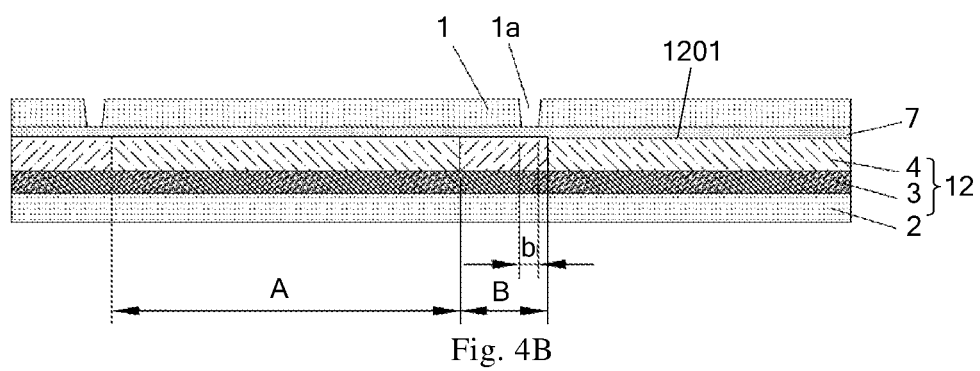
FIG. 4B is a structural diagram of an attached film in a film attaching method provided by a second embodiment of the present disclosure.

In another embodiment, referring to FIG. 4A and FIG. 4B together, the pre-cutting process S100 includes: cutting the film 1 in the thickness direction of the film 1 to remove a portion corresponding to the first partition b of the display panel to form the removed portion 1a penetrating the film 1 in the thickness direction; and applying a glue on the cut film 1 to form a glue layer 7. A surface of the film 1 close to the glue layer 7 may be referred to as the surface 101 to be attached of the film 1.

As shown in FIG. 4B, in the attaching process S200, the cut film 1 is attached to the surface 1201 to be attached of the display panel 12 by using the glue layer 7.

Figure 5:
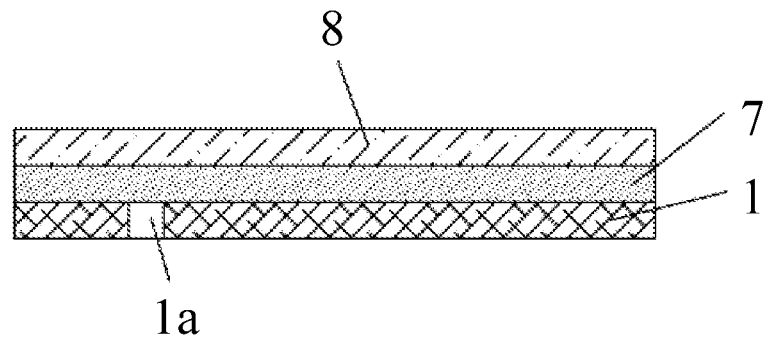
FIG. 5 is a structural diagram of a film after a pre-cutting process in a film attaching method provided by a third embodiment of the present disclosure.

If the removed portion 1a is large, upon the cut film 1 being transferred onto the display panel, a phenomenon that the film 1 is broken may happen. In order to avoid this phenomenon, referring to FIG. 5, the pre-cutting process S1001 includes: cutting the film 1 in the thickness direction of the film 1 to remove a portion of the film 1 corresponding to the first partition b of the display panel; applying a glue on the surface to be attached of the cut film 1 to form a glue layer 7; and forming a first protective film 8 on the glue layer 7.

On the basis of the pre-cutting process S1001, the attaching process S2001 may include: separating the first protective film 8 from the glue layer 7; after the glue layer 7 is aligned with the display panel, attaching the glue layer 7 to the surface to be attached of the display panel, such that a region where the removed portion of the film 1 is located corresponds to the first partition b of the display panel. The display panel and the film 1 are attached together through the glue layer 7.

By means of the first protective film 8, the film 1 can be protected from being broken.

Figure 6A:
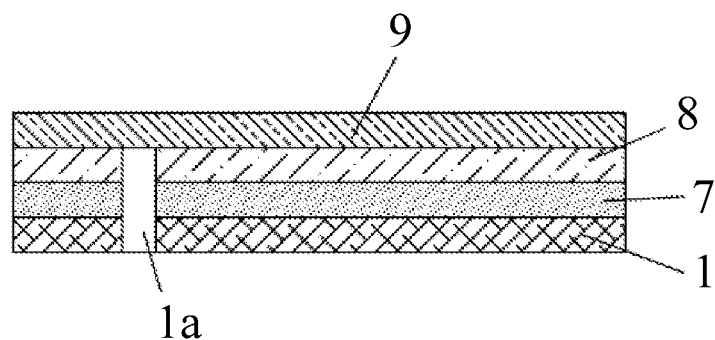
FIG. 6A is a structural diagram of a film after a pre-cutting process in a film attaching method provided by a fourth embodiment of the present disclosure.
Figure 6B:
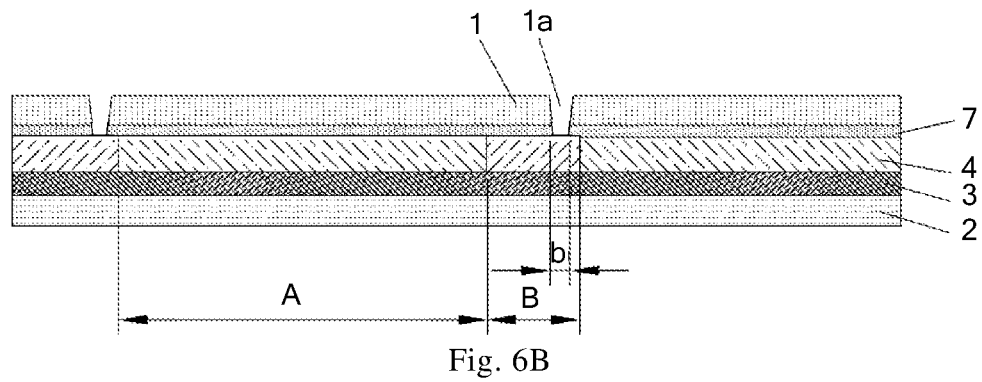
FIG. 6B is a structural diagram of an attached film in a film attaching method provided by a fourth embodiment of the present disclosure.

There is also another method for preventing the film 1 from being broken. Referring to FIG. 6A and FIG. 6B, the pre-cutting process S1002 includes: applying a glue on the surface to be attached of the film 1 to form a glue layer 7; forming a first protective film 8 on the glue layer 7; cutting the film 1, the glue layer 7 and the first protective film 8 in their thickness direction (after cutting the film 1, continuing to cut the glue layer 7 and the first protective film 8 in situ), to remove a portion of the film 1, the glue layer 7 and the first protective film 8 corresponding to the first partition b of the display panel; and forming a second protective film 9 on a surface of the first protective film 8 away from the glue layer 7, and an adhesive force between the first protective film 8 and the second protective film 9 is greater than an adhesive force between the first protective film 8 and the glue layer 7.

In some embodiments, on the basis of the pre-cutting process S1002, the attaching process S2002 comprises: separating the first protective film 8 and the second protective film 9 which are bonded together from the glue layer 7; and, after aligning the glue layer 7 with the display panel, attaching the glue layer 7 to the surface to be attached of the display panel, such that the removed portion 1a of the film 1 corresponds to the first partition b of the display panel.

The integrity of the film 1 can be improved by the abovementioned second protective film 9. Besides, it can be achieved that the first protective film 8 and the second protective film 9 can be simultaneously separated from the glue layer 7 by making the adhesion between the first protective film 8 and the second protective film 9 larger than the adhesion between the first protective film 8 and the glue layer 7.

In the embodiments of the present disclosure, the film 1 may also be attached to the display panel without a glue layer. For example, the film 1 is attached to the display panel by an electrostatic force or the like.

Figure 7A:
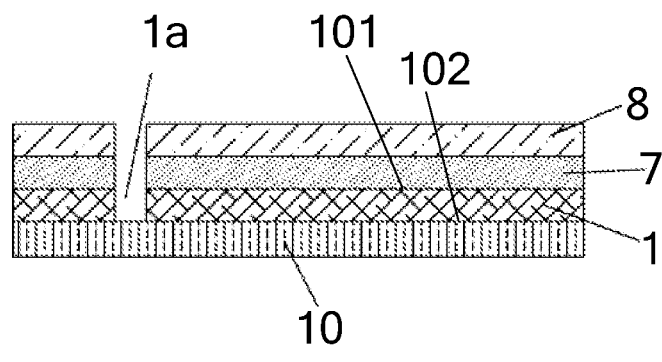
FIG. 7A is a structural diagram of a film after a pre-cutting process in a film attaching method provided by a fifth embodiment of the present disclosure.
Figure 7B:
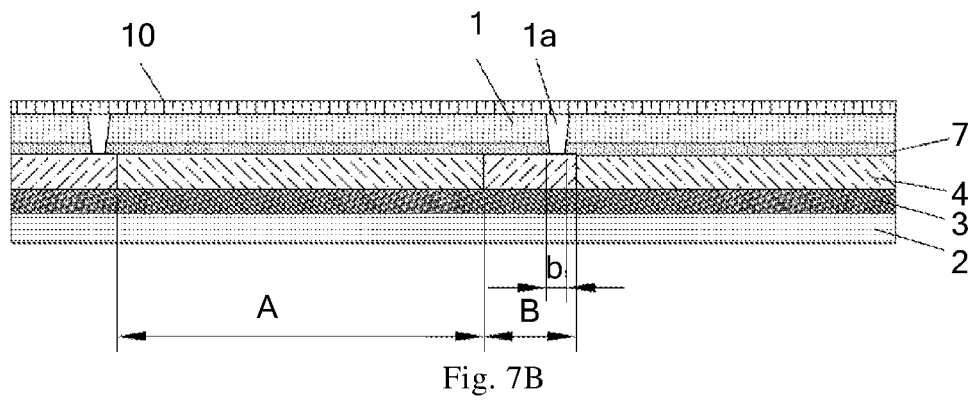
FIG. 7B is a structural view of an attached film in a film attaching method provided by a fifth embodiment of the present disclosure.

In some embodiments, referring to FIG. 7A and FIG. 7B together. For example, on the basis of the pre-cutting process S1001 or S1002 given in the abovementioned embodiment, the attaching method of the film further includes: forming a third protective layer 10 on a surface 102 at an opposite side of the surface 101 to be attached of the cut film 1.

For example, after the attaching process S2001 or S2002 is completed, the third protective film 10 remains on the display panel to play a reinforcement role, and the third protective film 11 can be stripped before a subsequent process. For example, the subsequent process includes: full-cutting a motherboard having the display panel by using a laser to form a separate display panel. That is, the third protective film 11 can be stripped before cutting the motherboard of the display panel into a separate display panel with a laser. For example, the motherboard may include at least one display panel.

In some embodiments, before the attaching process, the attaching method further includes: removing the first protective film 8, and the attaching process includes: attaching the glue layer 7 to the display panel such that the removed portion 1a of the film 1 and the glue layer 7 corresponds to the first partition of the display panel, and can be attached as shown in FIG. 7B.

Figure 8:
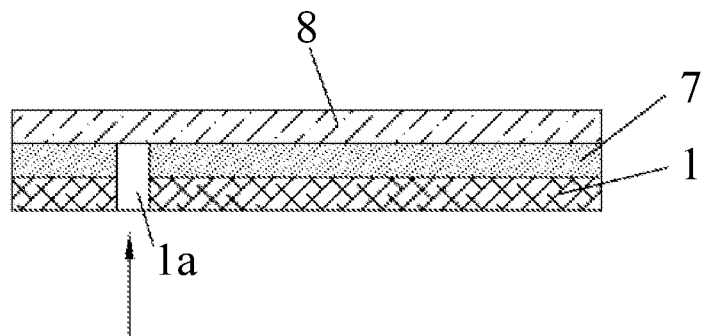
FIG. 8 is a structural diagram of a film after a pre-cutting process in a film attaching method provided by a sixth embodiment of the present disclosure.

Referring to FIG. 8, the pre-cutting process S1003 may include: applying a glue on the surface to be attached of the film 1 to form a glue layer 7; forming a first protective film 8 on the glue layer 7; and cutting the film 1 and the glue layer 7 in a thickness direction from a side opposite to the surface to be attached of the film 1 to form the removed portion 1a penetrating the film 1 and the glue layer 7 in the thickness direction (after cutting the film 1, continuing to cut the glue layer 7 in situ to penetrate the glue layer 7). The removed portion 1a corresponds to the first partition of the display panel.

For example, the attaching process S2003 may include: separating the first protective film 8 from the glue layer 7; and, after aligning the glue layer 7 with the display panel, attaching the glue layer 7 to the surface to be attached of the display panel, such that the removed portion 1a corresponds to the first partition b of the display panel. A structure after attaching may be shown in FIG. 9.

The abovementioned process of cutting the film 1 and the glue layer 7 in a thickness direction from a side opposite to the surface to be attached of the film 1 can be performed by using a laser cutting method or a cutter wheel cutting method, and it can be achieved that the film 1 and the glue layer 7 can be completely cut off and the first protective film 8 is not cut off by controlling the energy of laser or the pressure of the cutter wheel. In this case, even if the first protective film 8 is cut because the cutting is too deep, the integrity is not affected as long as the first protective film 8 is not completely cut off. Therefore, the requirement for cutting accuracy is not high.

In summary, the attaching method of the film provided by the abovementioned various embodiments of the present disclosure, by performing the pre-cutting process, the film is cut in the thickness direction of the film to remove the portion of the film corresponding to the first partition in the bonding region of the display panel, and then the attaching process is performed to attach the cut film to the surface to be attached of the display panel after aligning the cut film with the display panel, such that the removed portion 1*a* of the film corresponds to the first partition of the display panel, so as to avoid the problem that a lead wire of the bonding region is cut off or the film cannot be cut, thereby improving the cutting yield and facilitating automation.

At least one embodiment of the present disclosure further provides a manufacturing method of a display panel, which includes the film attaching method provided by the various embodiments of the present disclosure.

The manufacturing method of the display panel provided by the present disclosure can avoid the problem that the lead wire of the bonding region is cut off or the film cannot be cut by adopting the attaching method of the film provided by the abovementioned various embodiments of the present disclosure, thereby improving the cutting yield and facilitate automation.

Figure 9:
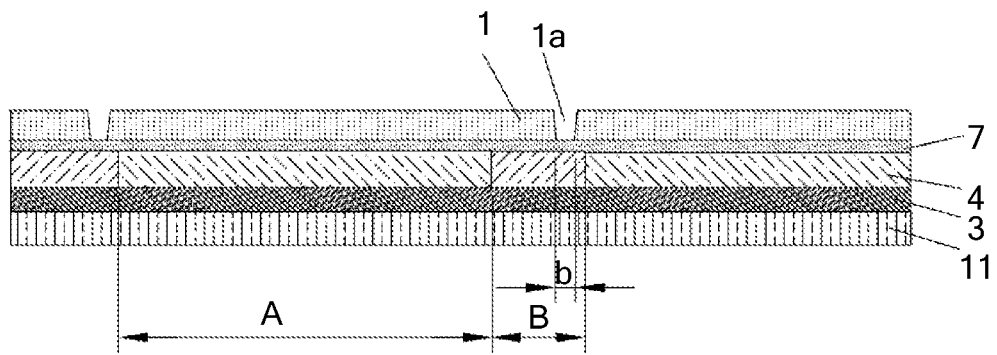
FIG. 9 is a structural diagram of a display panel obtained by attaching a film by using a manufacturing method of a display panel according to an embodiment of the present disclosure.

At least one embodiment of the present disclosure further provides a manufacturing method of a display panel, including: providing a transparent substrate 2, forming a flexible substrate 3 on the transparent substrate 2; forming a display module in a display region A on the flexible substrate 3, the display module includes an array substrate 4, an OLED display device 5, and an encapsulation layer; the film 1 is attached to the encapsulation layer by the attaching method of the film provided by the abovementioned various embodiments of the present disclosure. The transparent substrate 2 is separated from the flexible substrate 3 by using a laser stripping method; and a flexible substrate protective film 11 is attached on a surface of the flexible substrate 3 away from the display module, as shown in FIG. 9.

The manufacturing method of the display panel provided by at least one embodiment of the present disclosure can avoid the problem that a lead wire of the bonding region is cut off or the film cannot be cut by adopting the attaching method of the film provided by the abovementioned various embodiments of the present disclosure, thereby improving the cutting yield and facilitating automation.

Figure 10A:
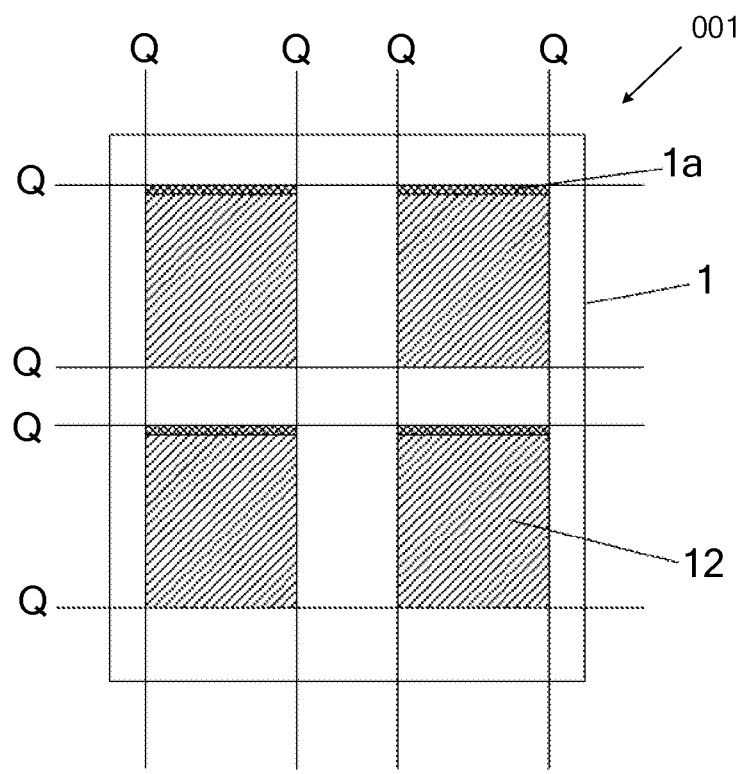
FIG. 10A is a diagram showing a cutting line distribution of a flexible substrate in a plan view direction.
Figure 10B:
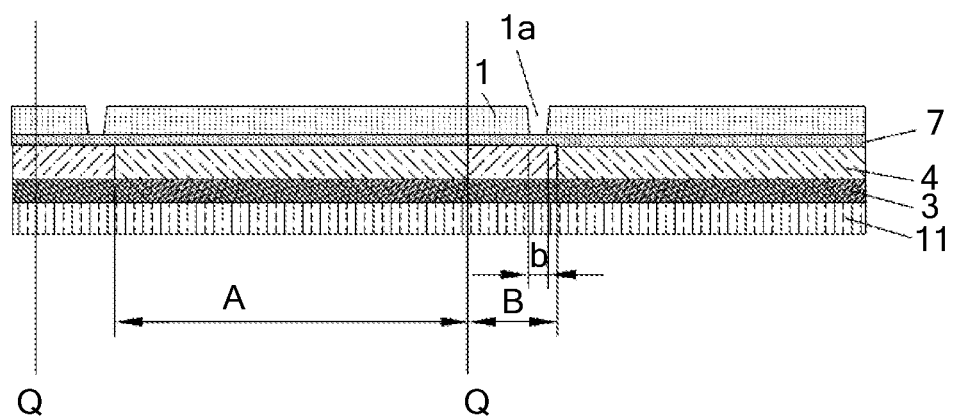
FIG. 10B is a diagram showing a cutting line distribution of a flexible substrate in a cross-sectional direction.

In some embodiments, referring to FIG. 10A and FIG. 10B together, a plurality of display panels 12 may be formed on the same flexible substrate 3 and distributed in an array, for example, in a rectangular array. For example, as shown in FIG. 10A, a motherboard 001 of the display panel includes four display panels 12.

Figure 10C:
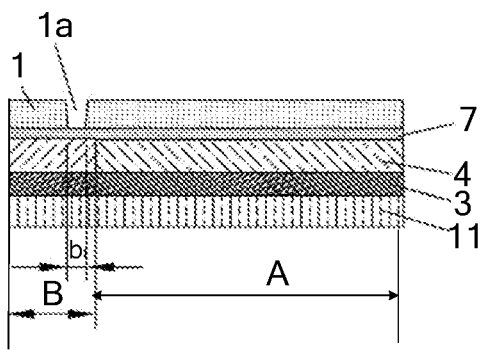
FIG. 10C is a structural diagram of a cut display panel.

After the attachment of the flexible substrate protective film 11 is completed, the manufacturing method of the display panel further comprises: cutting (fully cutting) the flexible substrate 3, such that the plurality of display panels are independent from each other to obtain a single display panel. As shown in FIGS. 10A and 10B, the flexible substrate 3 is cut in accordance with the cutting line Q. The display panel obtained after cutting can be as shown in FIG. 10C.

Figure 10D:
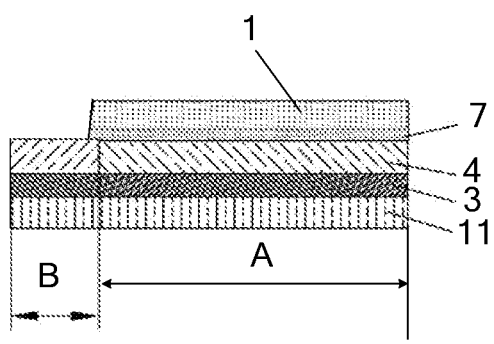
FIG. 10D is a structural diagram of the display panel after peeling off the film in the bonding region.

In some embodiments, the manufacturing method of the display panel further comprises: stripping the film corresponding to a bonding region B on the independent display panel obtained after the cutting. As shown in FIG. 10D, for example, in this process, the glue layer located in the bonding region B can be removed together, thereby facilitating a subsequent bonding process.

Figure 10E:
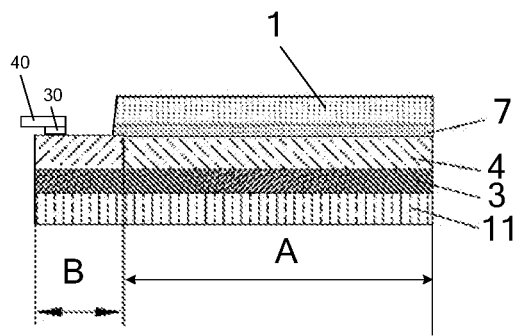
FIG. 10E is a structural diagram showing a connection between a display panel and an external circuit.

In some embodiments, as shown in FIG. 10E, an external circuit 40 is electrically connected to the display panel through an anisotropic conductive adhesive 30. For example, the external circuit 40 is electrically connected to lead wires located in the bonding region through the anisotropic conductive adhesive 30.

In the embodiments of the present disclosure, in the attaching method of the film, different forms of the removed portion 1*a* may be employed.

In some embodiments, the removed portion 1*a* corresponds to the entire bonding region B. In some embodiments, the removed portion 1*a* corresponds to a portion of the bonding region B. In this case, a plan view of the film after cutting may be as shown in FIG. 3A, and the removed portion 1*a* is a closed opening. As shown in FIG. 3A, in a case where the motherboard includes a plurality of display panels, the adjacent removed portions 1*a* are not connected to facilitate transferring the film 1 onto the display panel.

Figure 11:
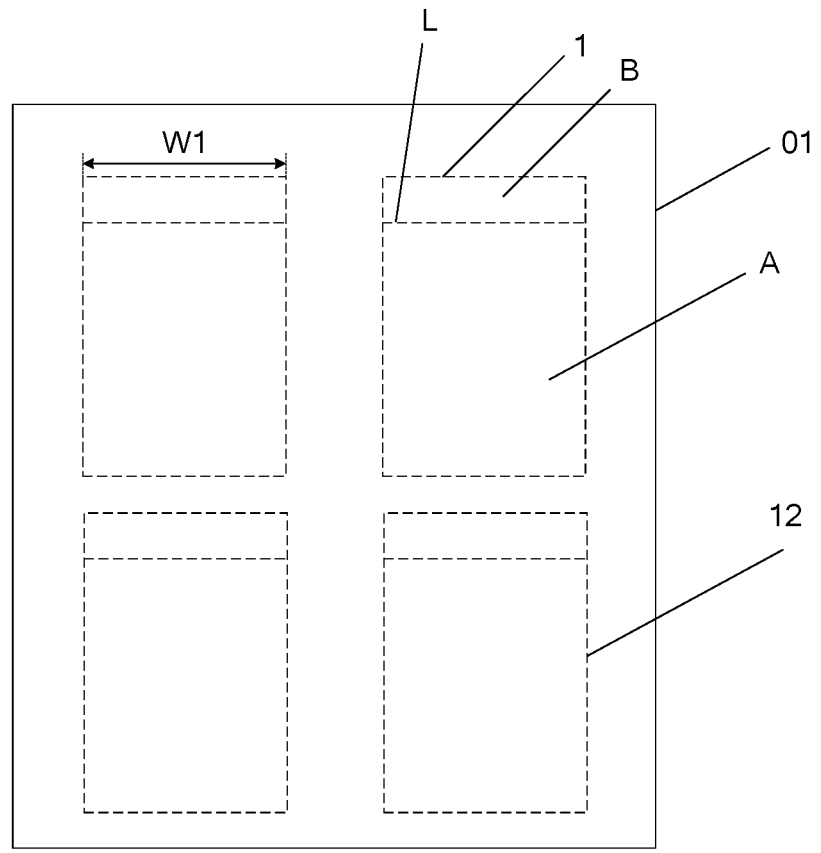
FIG. 11 is a schematic diagram of each display panel on a motherboard of a display panel.

For example, as shown in FIG. 11, a boundary line between the display region A and the bonding region B is L.

Figure 12A:
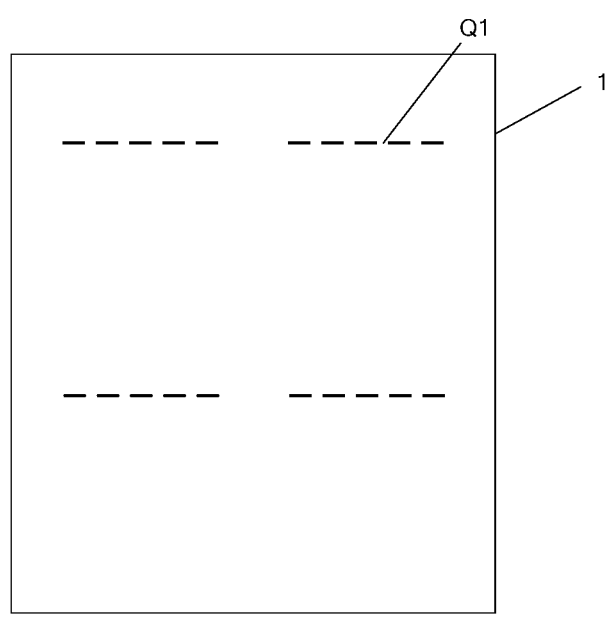
FIG. 12A is a schematic diagram showing a cutting line in a pre-cutting process in a film attaching method provided by an embodiment of the present disclosure.
Figure 12B:
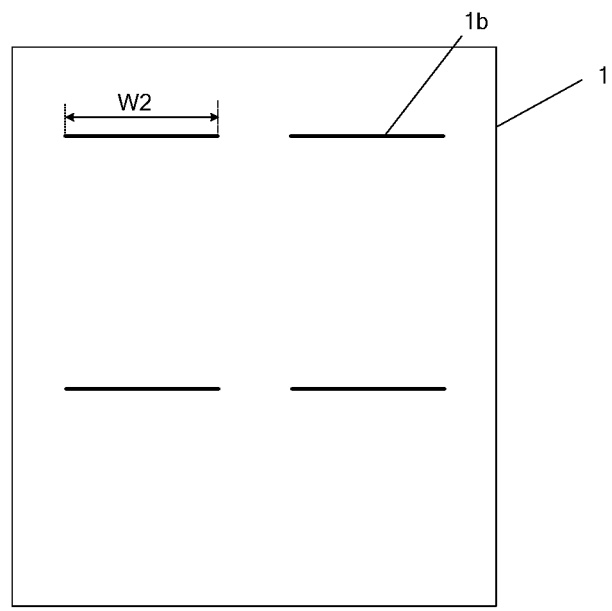
FIG. 12B is a schematic diagram of a cut film in a pre-cutting process in a film attaching method provided by an embodiment of the present disclosure.

In some embodiments, as shown in FIG. 12A, in the pre-cutting process, the film 1 is cut in accordance with the cutting line Q1, as shown in FIG. 12B, after the cutting is completed, a linear removed portion 1*b* is formed in the film 1, and the linear removed portion 1*b* corresponds to the boundary line L of the bonding region and the display region.

In some embodiments, as shown in FIGS. 11 and 12B, a length W2 of the linear removed portion 1*b* is larger than a width W1 of a single display panel 12 in a lengthwise direction of the removed portion 1*b*, which is favorable to removing the film in the bonding region after the full cutting. During the process of removing a portion of the film 1 corresponding to the bonding region B, the glue layer can be simultaneously removed, thereby facilitating the bonding process. For example, the film of the bonding region B can be removed by a stripping method.

Figure 13A:
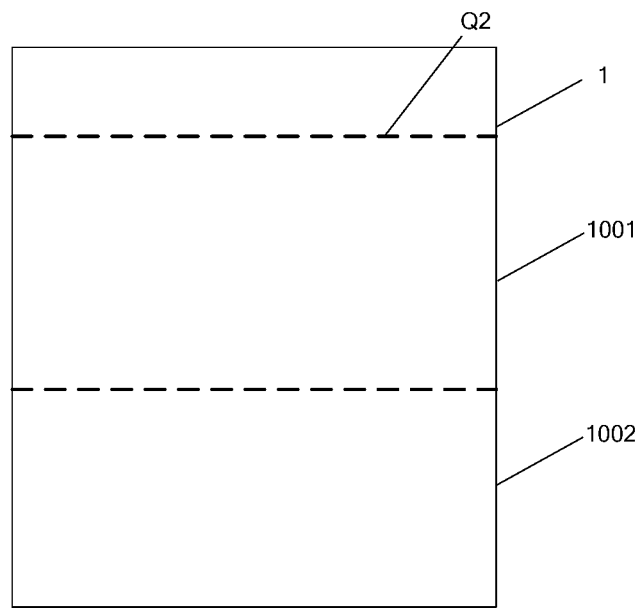
FIG. 13A is a schematic diagram of a cutting line in a pre-cutting process in a film attaching method provided by another embodiment of the present disclosure.
Figure 13B:
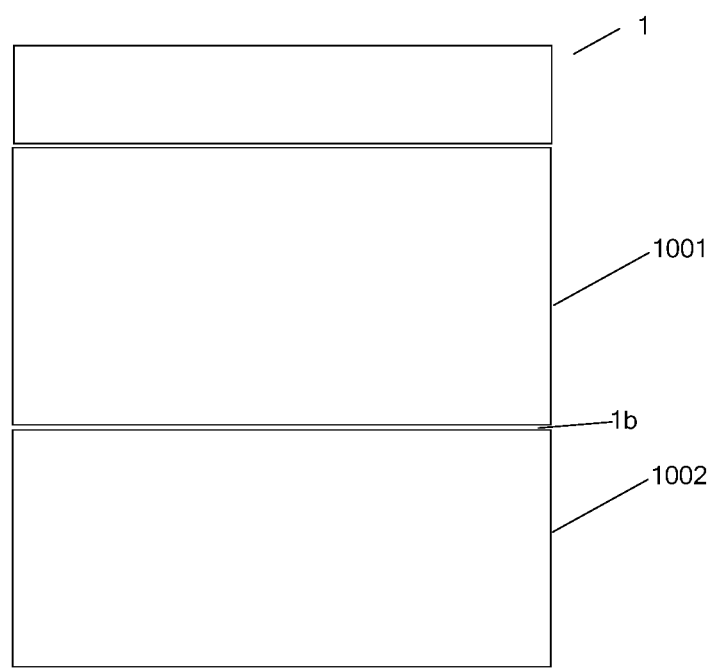
FIG. 13B is a schematic diagram of a cut film in a pre-cutting process in a film attaching method provided by another embodiment of the present disclosure.

In some embodiments, as shown in FIG. 13A, the film 1 is pre-cut in accordance with the cutting line Q2, whereby, as shown in FIG. 13B, the linear removed portion 1*b* separates the film 1 into two separate portions 1001 and 1002. In this case, the formation of a glue layer or other complete layer structure on the film may facilitate the transfer of the film.

Some embodiments of the present disclosure further provide a manufacturing method of a display device, including any one of the abovementioned two manufacturing methods of the display panel provided by the present disclosure.

The manufacturing method of the display device provided by the present disclosure can avoid the problem that a lead wire of the bonding region is cut off or the film cannot be cut by adopting any one of the abovementioned two manufacturing methods of the display panel provided by the present disclosure, thereby improving the cutting yield and facilitating automation.

It is to be noted that, for the sake of clarity, the thickness of the layer or region is enlarged in the drawings for describing the embodiments of the present disclosure. It will be understood that upon an element such as a layer, a film, a region or a substrate being referred to as being "on" or "under", the element may be directly "on" or "under" another element, or there may be intermediate elements.

Besides, in the case of no conflict, the features of the same embodiment and different embodiments of the present disclosure may be combined with each other.

The foregoing is only the embodiments of the present invention and not intended to limit the scope of protection of the present invention, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A film attaching method, comprising a pre-cutting process and an attaching process, wherein
    the pre-cutting process comprises cutting the film in a thickness direction of the film to form a removed portion; and
    the attaching process comprises aligning the film having the removed portion with a display panel, and attaching the film having the removed portion to a surface to be attached of the display panel;
    wherein, in the pre-cutting process, after placing and fixing the film on a vacuum adsorption stage, cutting the film.

2. The attaching method of the film according to claim 1, wherein the pre-cutting process further comprises: forming a glue layer on a surface to be attached of the film having the removed portion.

3. The attaching method of the film according to claim 2, wherein the pre-cutting process further comprises: forming a first protective film on a side of the glue layer away from the film.

4. The attaching method of the film according to claim 3, wherein the attaching process further comprises: before attaching the film having the removed portion to the surface to be attached of the display panel, separating the first protective film from the glue layer.

5. The attaching method of the film according to claim 4, wherein the attaching process further comprises: attaching the film having the removed portion with the display panel through the glue layer.

6. The attaching method of the film according to claim 2, wherein the pre-cutting process further comprises: forming a third protective film on a side opposite to the surface to be attached of the film having the removed portion.

7. The attaching method of the film according to claim 1, wherein the display panel comprises a bonding region and a display region adjacent to the bonding region, the removed portion comprises a linear removed portion, the linear removed portion corresponds to a boundary line between the bonding region and the display region.

8. The attaching method of the film according to claim 7, wherein the film is separated by the linear removed portion into two separate portions.

9. The attaching method of the film according to claim 7, wherein a length of the linear removed portion is larger than a width of the display panel in a lengthwise direction of the linear removed portion.

10. A manufacturing method of a display panel, comprising the attaching method of the film according to claim 1.

11. The manufacturing method of the display panel according to claim 10, further comprising cutting the display panel to separate the display panel, and removing the film in a bonding region of the display panel.

12. The manufacturing method of the display panel according to claim 10, further comprising:
    bonding an external circuit to the display panel.

13. The manufacturing method of the display panel according to claim 10, further comprising:
    providing a transparent substrate, and forming a flexible substrate on the transparent substrate;
    forming a display module in a display region of the flexible substrate, the film being attached on the display module;
    separating the transparent substrate from the flexible substrate by a laser stripping method;
    attaching a flexible substrate protective film on a surface of the flexible substrate away from the display module; and
    cutting the flexible substrate to form the display panel.

14. A manufacturing method of a display device, comprising the manufacturing method of the display panel according to claim 10.

15. A film attaching method, comprising a pre-cutting process and an attaching process, wherein
    the pre-cutting process comprises cutting the film in a thickness direction of the film to form a removed portion; and
    the attaching process comprises aligning the film having the removed portion with a display panel, and attaching the film having the removed portion to a surface to be attached of the display panel;
    wherein the pre-cutting process further comprises:
    before cutting the film, forming a glue layer and a first protective film on the film in sequence before cutting the film;
    after cutting the film, continuing to cut the glue layer and the first protective film in situ to penetrate the glue layer and the first protective film; and
    forming a second protective film on a surface of the first protective film away from the glue layer,
    wherein an adhesive force between the first protective film and the second protective film is greater than an adhesive force between the first protective film and the glue layer.

16. The attaching method of the film according to claim 15, wherein the attaching process further comprises: before attaching the film having the removed portion to the surface to be attached of the display panel, separating the first protective film and the second protective film which are bonded together from the glue layer.

17. A film attaching method, comprising a pre-cutting process and an attaching process, wherein
    the pre-cutting process comprises cutting the film in a thickness direction of the film to form a removed portion; and
    the attaching process comprises aligning the film having the removed portion with a display panel, and attaching the film having the removed portion to a surface to be attached of the display panel;
    wherein the pre-cutting process further comprises:
    before cutting the film, forming a glue layer on the film and forming a first protective film on the glue layer, and
    after cutting the film, continuing to cut the glue layer in situ to penetrate the glue layer.

18. The attaching method of the film according to claim 17, wherein the attaching process further comprises: before attaching the film having the removed portion to the surface to be attached of the display panel, separating the first protective film from the glue layer.

19. The attaching method of the film according to claim 17, wherein the removed portion is a closed opening, the display panel comprises a bonding region and a display region adjacent to the bonding region, upon attaching the film having the removed portion to the surface to be attached of the display panel, the removed portion corresponds to a first partition of the display panel, and the first partition is at least a part of the bonding region.

20. The attaching method of the film according to claim 17, wherein, in the pre-cutting process, after placing and fixing the film on a vacuum adsorption stage, cutting the film.

* * * * *